United States Patent [19]
Lyford

[11] Patent Number: 6,058,024
[45] Date of Patent: May 2, 2000

[54] ELECTRONIC INSTRUMENT WITH ELECTROMAGNETIC INTERFERENCE SHIELD AND METHOD OF MANUFACTURING

[75] Inventor: J. Steve Lyford, Portland, Oreg.

[73] Assignee: Tektronix, Inc., Beaverton, Oreg.

[21] Appl. No.: 08/895,937

[22] Filed: Jul. 17, 1997

[51] Int. Cl.[7] .................................................. H05K 9/00
[52] U.S. Cl. .................... 361/816; 361/752; 361/753; 361/799; 361/800; 361/818; 174/35 R
[58] Field of Search ..................................... 361/728, 736, 361/752, 753, 756, 759, 796, 799, 800, 802, 816, 818; 174/35 R, 51; 211/41.17; 206/706, 719

[56] References Cited

U.S. PATENT DOCUMENTS

| | | | |
|---|---|---|---|
| 4,717,990 | 1/1988 | Tugcu | ..................................... 361/800 |
| 5,438,482 | 8/1995 | Nakamura et al. | ..................... 361/816 |
| 5,519,169 | 5/1996 | Garrett et al. | ...................... 361/800 X |

*Primary Examiner*—Leo P. Picard
*Assistant Examiner*—Jayprakash N. Gandhi
*Attorney, Agent, or Firm*—Bennet K. Langlotz

[57] ABSTRACT

An electronic instrument having a housing containing a circuit assembly with a hole. A first shield in the housing is positioned adjacent the hole on one side of the circuit assembly, and a second shield is positioned on the opposite side of the circuit assembly. A spring has a first portion compressed between the circuit assembly and the first shield, and a second portion extending through the hole and biased against the second shield. The spring may be a coil spring with the first portion having a larger diameter to provide a shoulder to rest against the circuit, and the second portion having a smaller diameter to pass through the hole.

20 Claims, 3 Drawing Sheets

ELECTRONIC INSTRUMENT WITH ELECTROMAGNETIC INTERFERENCE SHIELD AND METHOD OF MANUFACTURING

FIELD OF THE INVENTION

This invention relates to shielding to prevent electromagnetic interference, and more particularly to apparatus and methods for electrically connecting shielding to a printed circuit board of an electronic instrument.

BACKGROUND AND SUMMARY OF THE INVENTION

Electromagnetic interference (EMI) is a well known problem with electronic instruments having circuitry operating at high frequencies. Uncontrolled EMI from one instrument may interfere with the operation of other nearby sensitive electronic instruments. Accordingly, EMI has been governmentally regulated to limit the amount of tolerated EMI emissions.

To control, limit, or avoid EMI emissions, instruments are often shielded by use of metal housings, or by metal shield plates within a housing to surround critical circuitry. Even instruments operating a low frequencies that do not generate EMI may be sensitive to emissions by other instruments. In particular, hand held instruments are susceptible because a user acts as an antenna while touching an instrument. A particular concern is the 60 Hz background signal present in most indoor environments in which an instrument is likely to be used.

For effective shielding, the shield must be electrically connected to the circuitry; typically the shield is connected to the ground plane. However, the connection of shield plates to a node on a printed circuit board (PCB) presents difficulties. Normally, components are soldered to a PCB in a single efficient process such as wave soldering or reflow. To connect shields to a PCB node normally requires a subsequent manual operation, increasing manufacturing costs and inviting assembler errors. In one approach, simple coil springs are hand soldered to a PCB to protrude perpendicularly from the board. When the shield is installed, it presses against the springs, providing electrical contact. While effective, the manual process generates inefficiencies. Automation of the spring soldering process is impractical because the required length of the springs makes them unstable during soldering; widening the bases of the springs to provide stability is undesirable because it consumes valuable space on the PCB. Other shield contact options include conventional EMI leaf spring clips, conductive foam pads, and plated cloth adhered with conductive adhesive. All these options present manufacturing and/or reliability difficulties.

The embodiment disclosed herein overcomes these limitations by providing an electronic instrument having a housing containing a circuit assembly with a hole. A first shield in the housing is positioned adjacent the hole on one side of the circuit assembly, and a second shield is positioned on the opposite side of the circuit assembly. A spring has a first portion compressed between the circuit assembly and the first shield, and a second portion extending through the hole and biased against the second shield. The spring may be a coil spring with the first portion having a larger diameter to provide a shoulder to rest against the circuit, and the second portion having a smaller diameter to pass through the hole.

DETAILED DESCRIPTION OF A PREFERRED EMBODIMENT

Figure 1:
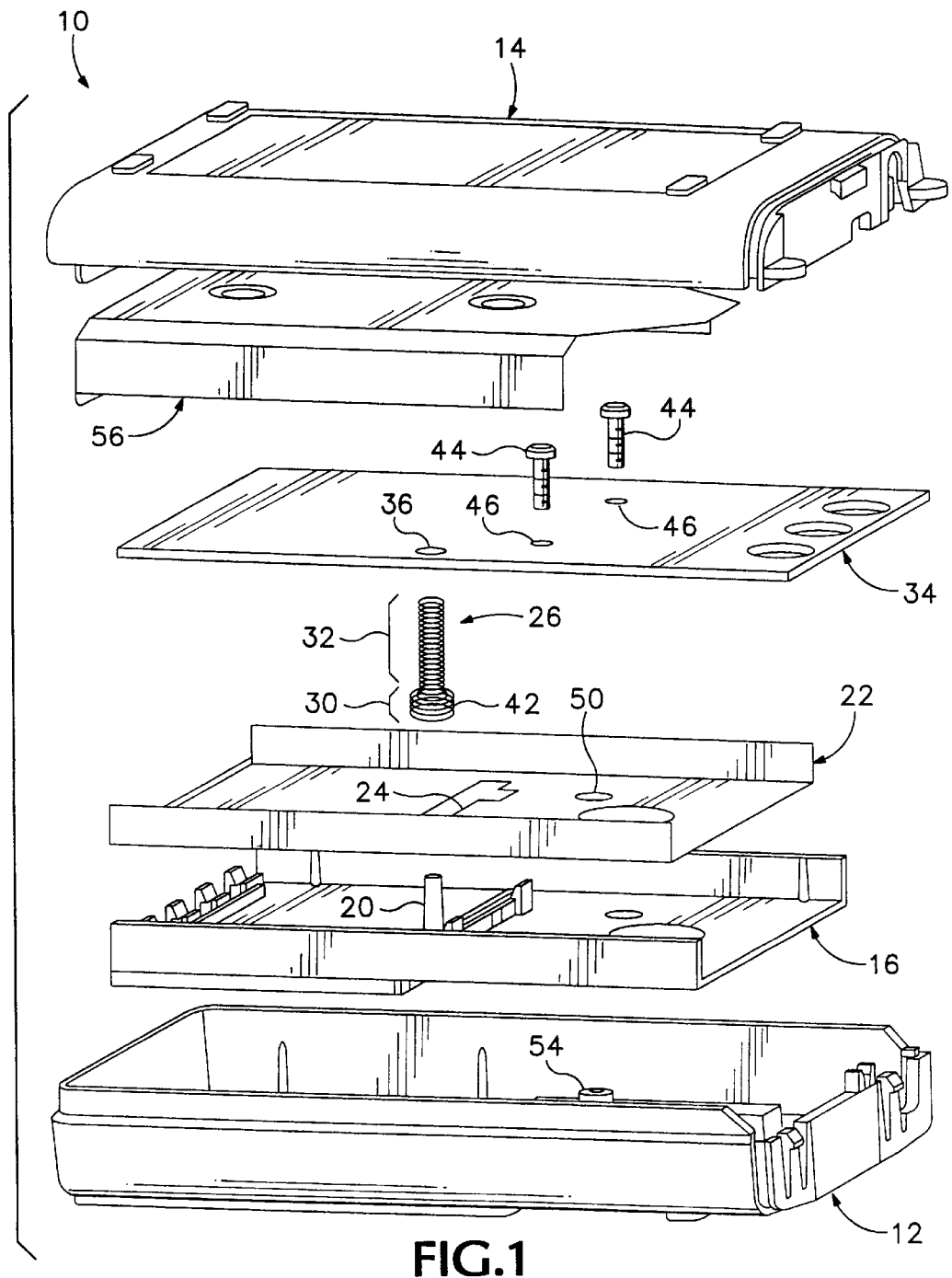
FIG. 1 is an exploded view of a hand held instrument case according to a preferred embodiment of the invention.

FIG. 1 shows an exploded view of a hand held electronic instrument 10 having a plastic clam shell housing with a front shell 12 and a rear shell 14. A plastic frame 16 is received within the cavity defined by the front shell, and has a planar rectangular shape that is substantially coextensive with the housing. A post 20 protrudes perpendicularly from the frame away from the front shell. An aluminum front shield 22 is coextensive with the front shell, and is secured laminarly against the rear surface of the frame using heat staking. A post aperture 24 in the front shield permits the passage of the post 20.

A coil spring 26 is received on the post. The spring has a T-shaped profile, with a short first portion 30 having a large diameter, and a long second portion 32 having a smaller diameter. Both portions are cylindrical and aligned on the same axis perpendicular to the planes of the frame and housing shells. The spring is formed of pre-nickel-coated wire of 0.015" (0.38 mm) diameter. The first portion has about 4–3 turns, with a diameter of 0.285" (7.24 mm) and a length of 0.150" (3.8 mm); the second portion has about 15–20 turns, with a diameter of 0.125" (3.17 mm) and a length of 0.815" (20.7 mm). The frame post 20 has a width slightly less than the inside diameter of the second narrow portion of the spring, so that the spring may be compressed and extended without binding or resistance by the post. The post serves to support the spring against lateral deflection and buckling. The post aperture of the front shield is sized to closely receive the post and to be smaller than the inside diameter of the first wide portion of the spring so that the spring makes ohmic contact with the front shield when assembled.

A circuit board 34 containing instrument circuitry has a through hole 36 with an annular land 40 on the front surface of the board that faces the front shell 12. The through hole has a diameter slightly greater than the outside diameter of the second narrow portion 32 of the spring, and is substantially smaller than the first wider portion of the spring. Thus, the narrow portion 32 will pass through the hole 36, while the wider portion 30 will not. The land 40 is electrically connected to ground on the board, has a diameter larger than the diameter of the wide spring portion 30, and is concentric with the hole 36. Consequently, a shoulder 42 where the first portion 30 meets the second portion 32 will rest against the land, making electrical contact.

A pair of screws 44 secures the board 34 to the front shell 12, passing through holes 46 on the board, holes 50 in the front shield, and holes 52 in the frame to engage bosses 54 on the front shell. An aluminum rear shield 56 is secured to the rear shell 14, which is attached to the front shell to enclose a chamber 60 as shown in FIG. 2.

Figure 3:
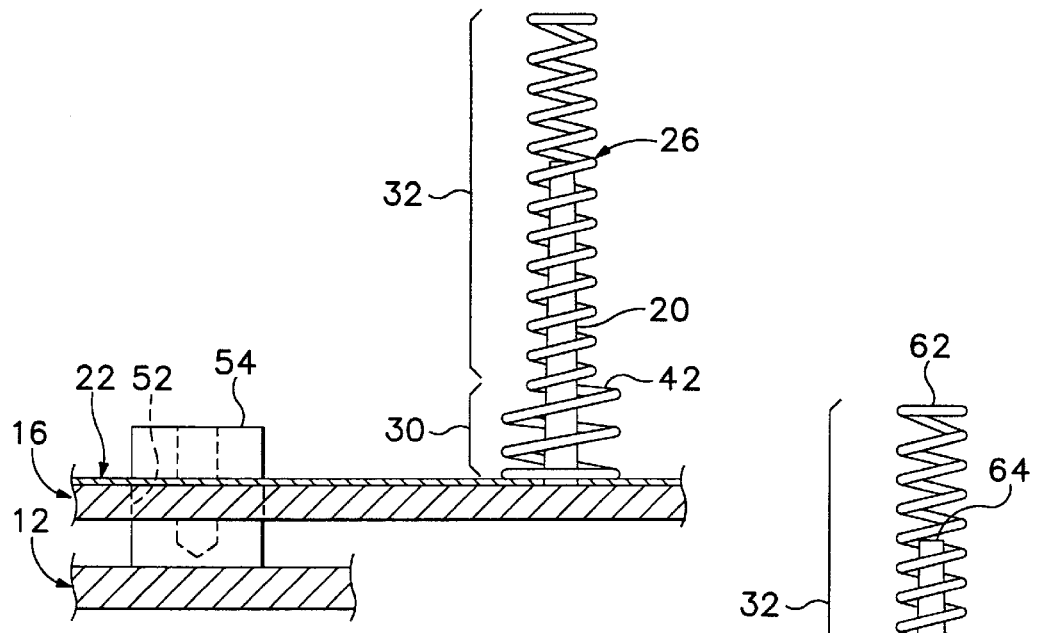
FIG. 3, 4, and 5 are enlarged sectional views of the embodiment of FIG. 1 showing a sequence of assembly.
Figure 4:
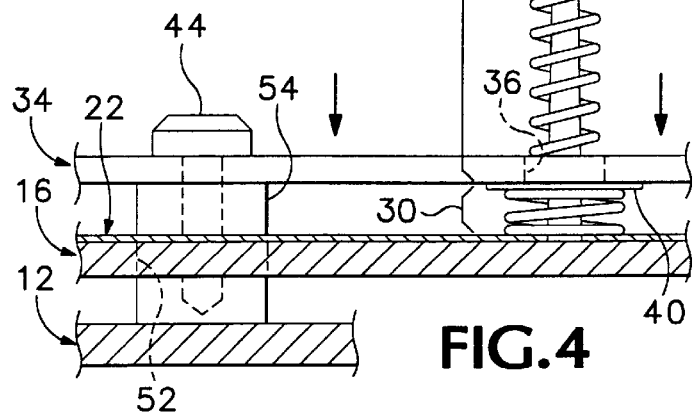

As shown in FIG. 3, to assemble the instrument, the frame 16 and front shield 22 are connected and placed inside the front shell 12 with the post 20 protruding away from the shell 12, and oriented in an upward direction. The frame boss 54 is inserted in the frame hole 52. The spring 26 is placed over the post, with the end of the first portion 30 resting against the shield 22. Then, as shown in FIG. 4, the printed circuit board 34 is lowered toward the frame 16, with the second portion 32 of the spring passing through the through hole 36, and the land 40 resting against the spring shoulder 42. The board is forced downward until it contacts the bosses 54, and is secured to the bosses by screws 44. This compresses the spring's first portion 30 from its unconstrained length of 0.150" (3.8 mm) to a compressed length of 0.087" (2.21 mm). Consequently, the as yet uncompressed second portion 32 is shifted downward, yet its free end 62 extends beyond the free end 64 of the post by 0.275" (7.0 mm). The condition shown in FIG. 4 also illustrates the condition when a user or service technician removes the rear shell of the device. The spring is captured between the board and frame, and maintained on a proper axis by the post to facilitate reclosure.

Figure 2:
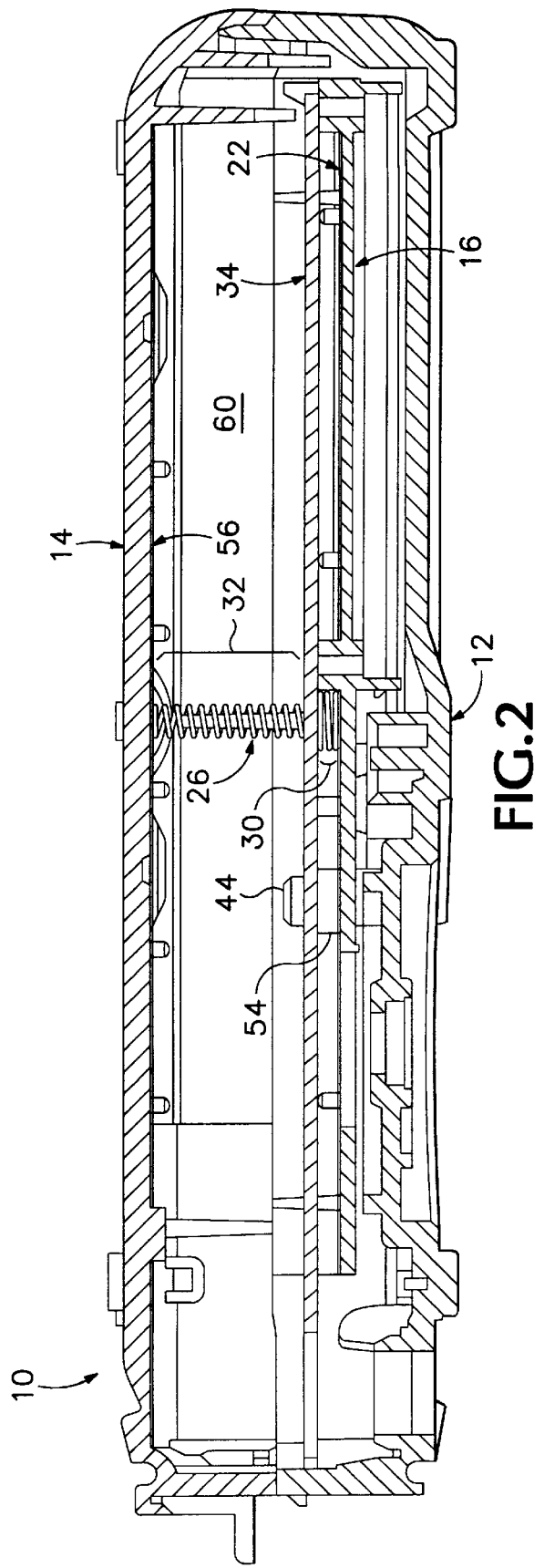
FIG. 2 is a sectional view of the embodiment of FIG. 1.
Figure 5:
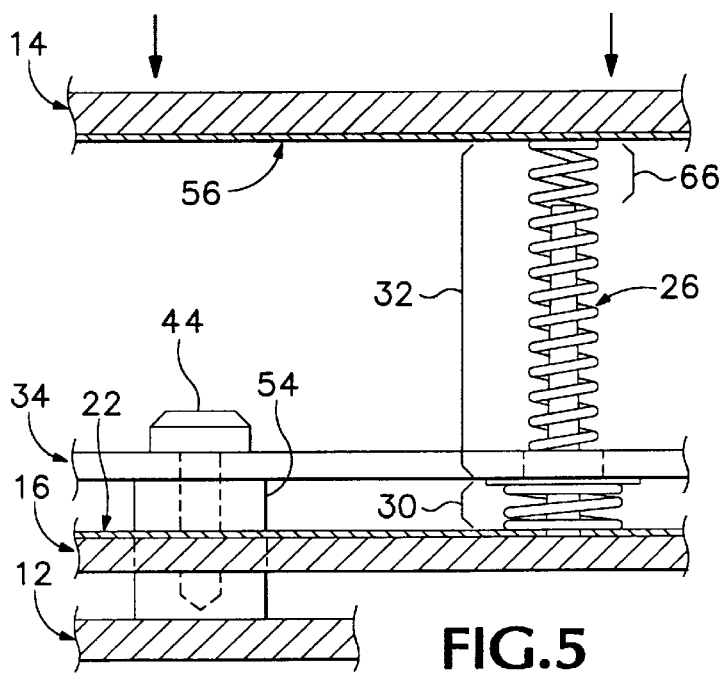

In FIG. 5, the rear shell 14 has been connected to mate with the front shell 12 at their edges (shown in FIG. 2). The rear shield 56 contacts the free end 62 of the second spring portion 32, and compresses it to a length of 0.719" (18.2 mm). The shield surface remains spaced apart from the free end 64 of the post by a sufficient gap 66 of 0.105" (2.7 mm) to ensure that the spring does not become pinched in the gap, with such pinching preventing closure of the shell. In the assembled condition, there is a greater compressive force in the first portion than in the second portion. The difference between these two forces is the force with which the shoulder 42 is biased against the land 40. The first portion is compressed to 58% of its length, while the second portion is only compressed to 88% of its length.

While the disclosure is made in terms of a preferred embodiment, the invention is not intended to be so limited. For instance, the portions of the spring may be conical and not cylindrical, as long as the first portion has a wide portion to press against the land without passing through, and the second portion has sufficient length and narrow diameter to pass through the printed circuit board hole.

I claim:

1. An electronic instrument comprising:
   a first conductive shield and a second conductive shield spaced apart to define a shielded space therebetween;
   a printed circuit board positioned in the shielded space and having a first major surface facing the first shield and an opposed second major surface facing the second shield;
   the printed circuit board defining a through hole having a hole width;
   an elongated conductive spring element electrically connected to the first and second shields and to the printed circuit board;
   the spring having a first end portion, an opposed second portion, and an intermediate portion connected between the first and second end portions;
   the first end portion of the spring having a first width greater than the hole width, such that the first end is prevented from passing through the hole; and
   the intermediate portion and the second end portion having a second width such that they are permitted to pass through the hole.

2. The instrument of claim 1 wherein the first portion of the spring is captured between the board and the first shield.

3. The instrument of claim 1 wherein the intermediate portion of the spring is received within the through hole.

4. The instrument of claim 1 wherein the second end portion is biased against the second shield.

5. The instrument of claim 1 wherein the intermediate portion and the second portion have the same width.

6. The instrument of claim 1 wherein the spring is a coil spring.

7. The instrument of claim 6 wherein the first portion defines a shoulder adjacent the intermediate portion, such that the shoulder rests against the board while the intermediate portion passes through the hole.

8. The instrument of claim 1 including a post extending from the first shield, through the through hole, and toward the second shield, and wherein the spring encompasses the post, such that lateral deflection of the spring is limited by the post.

9. A method of assembling an electronic instrument comprising the steps:
   providing a spring having a first end portion with a first width and a second portion with a smaller second width;
   inserting the second portion into a through hole of a printed circuit board;
   positioning the printed circuit board adjacent a first conductive shield
   compressing the first portion between the first shield and the printed circuit board;
   positioning a second conductive shield adjacent the printed circuit board opposite the first shield, including biasing the second portion of the spring against the second shield.

10. The method of claim 9 including the step of positioning the spring to encompass a post extending away from the first shield.

11. The method of claim 10 wherein positioning the printed circuit board includes passing the post through the through hole.

12. The method of claim 9 including electrically connecting the first portion of the spring to the printed circuit board.

13. The method of claim 9 including compressing the first portion of the spring with a first force, and compressing the second portion of the spring with a lesser second force, such that the first portion is biased against the board.

14. The method of claim 9 wherein positioning the printed circuit board adjacent a first conductive shield includes securing the board to a housing frame to capture and retain the first portion of the spring.

15. An electronic instrument comprising:

a housing;

a circuit assembly within the housing defining a hole;

a first shield positioned in the housing adjacent the hole on a first side of the circuit assembly;

a second shield positioned in the housing adjacent the hole on an opposed second side of the circuit assembly; and a spring having a first portion compressed between the circuit assembly and the first shield and a second portion extending through the hole and biased against the second shield.

16. The instrument of claim 15 wherein the spring is a coil spring.

17. The instrument of claim 16 wherein the first portion defines a shoulder adjacent the intermediate portion, such that the shoulder rests against the circuit while the intermediate portion passes through the hole.

18. The instrument of claim 16 including a post connected to the housing and passing through the hole and through at least a portion of the spring.

19. The instrument of claim 16 wherein the hole has a selected diameter, and wherein a shoulder portion of the first portion adjacent the second portion has a diameter greater than the selected diameter.

20. The instrument of claim 15 including a conductive land adjacent the hole and registered with at least a portion of the first portion such that the first portion is electrically connected to the land.

* * * * *